United States Patent
Kim et al.

(10) Patent No.: US 7,652,939 B2
(45) Date of Patent: Jan. 26, 2010

(54) SEMICONDUCTOR MEMORY DEVICE AND METHOD FOR DRIVING THE SAME

(75) Inventors: Kyoung-Nam Kim, Kyoungki-do (KR); Ho-Youb Cho, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 48 days.

(21) Appl. No.: 11/987,832

(22) Filed: Dec. 5, 2007

(65) Prior Publication Data
US 2008/0205186 A1 Aug. 28, 2008

(30) Foreign Application Priority Data
Feb. 28, 2007 (KR) ...................... 10-2007-0020307

(51) Int. Cl.
*G11C 7/00* (2006.01)
(52) U.S. Cl. ................. 365/194; 365/233.1; 365/230.08
(58) Field of Classification Search ................. 365/194, 365/233.1, 230.08, 193
See application file for complete search history.

(56) References Cited

U.S. PATENT DOCUMENTS 6,937,534 B2 * 8/2005 Lim et al. ................... 365/194
7,362,643 B2 * 4/2008 Okada ........................ 365/222
7,453,745 B2 * 11/2008 Park et al. ................... 365/193

FOREIGN PATENT DOCUMENTS

| KR | 10-0640649 | 10/2006 |
|---|---|---|
| KR | 10-2006-0131475 | 12/2006 |

OTHER PUBLICATIONS

Korean Notice of Allowance issued in Korean Patent Application No. KR 10-2007-0020307, mailed Jul. 23, 2008.

* cited by examiner

*Primary Examiner*—David Lam
(74) *Attorney, Agent, or Firm*—IP & T Law Firm PLC

(57) ABSTRACT

A semiconductor memory device includes a pulse signal generator configured to combine a plurality of external command signals to generate a normal register control signal and an extended register control signal in response to a clock signal; a reset signal generator configured to receive operating information of a delay locked loop (DLL) circuit from an outside to generate a reset signal for a reset operation of the DLL circuit in response to the normal register control signal or the extended register control signal; and the DLL circuit configured to perform a reset operation in response to the reset signal.

20 Claims, 8 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application number 10-2007-0020307, filed on Feb. 28, 2007, which is incorporated by reference in its entirety.

BACKGROUND OF THE INVENTION

The present invention relates to semiconductor design technology, and more particularly, to a control circuit which is adapted for controlling a delay locked loop of a semiconductor memory device.

A system is implemented with a plurality of semiconductor devices. Among them, a semiconductor memory device is used to store data. The semiconductor memory device outputs data corresponding to addresses received from a data processor, e.g., a central processing unit (CPU), or stores data received from the data processor into unit cells corresponding to addresses inputted together with the data.

As the operating speed of the system increases, the data processor requires the semiconductor memory device to input/output data at higher speed. As semiconductor integrated circuit (IC) technologies rapidly develop, the operating speed of the data processor increases, but the data input/output speed of the semiconductor memory device does not keep up with the increased operating speed of the data processor.

Many attempts have been made to develop semiconductor memory devices that can increase data input/output speed up to the level required by the data processor. One of these semiconductor memory devices is a synchronous memory device that outputs data at each period of a system clock. Specifically, the synchronous memory device outputs or receives data to or from the data processor in synchronization with the system clock. However, because even the synchronous memory device could not keep up with the operating speed of the data processor, a double data rate (DDR) synchronous memory device was developed. The DDR synchronous memory device outputs or receives data at each transition of the system clock. That is, the DDR synchronous memory device outputs or receives data in synchronization with falling edges and rising edges of the system clock.

However, the system clock inevitably has a delay time until it arrives at a data output circuit because it passes through a clock input buffer, a clock transmission line, etc. Thus, if the data output circuit outputs data in synchronization with the delayed system clock, an external device will receive data that are not synchronized with rising edges and falling edges of the system clock.

To solve this problem, the semiconductor memory device uses a delay locked loop (DLL) circuit to lock a delay of a clock signal. The DLL circuit compensates for the delay caused by internal circuits of the semiconductor memory device until the system clock inputted to the semiconductor memory device is transferred to the data output circuit. The DLL circuit finds the delay time of the system clock, which is caused by the clock input buffer, the clock transmission line, etc. of the semiconductor memory device. Then, the DLL circuit delays the system clock as much as the found delay time and outputs the delayed system clock to the data output circuit. That is, the DLL circuit outputs a delayed-locked clock (DLL clock) to the data output circuit. The data output circuit outputs data in synchronization with the DLL clock. Therefore, the data are correctly outputted to the external circuit in synchronization with the system clock.

In an actual operation, the DLL clock is transferred to the output buffer at a time point earlier by one period than a time point when the data must be outputted, and the output buffer outputs data in synchronization with the received DLL clock. Therefore, the data is outputted faster than the delay of the system clock caused by the internal circuit of the semiconductor memory device. In this way, the data are correctly outputted in synchronization with the rising and falling edges of the system clock which is inputted to the semiconductor memory device. That is, the DLL circuit is a circuit to find how fast the data must be outputted in order to compensate for the delay of the system clock within the semiconductor memory device.

Meanwhile, a reset signal is internally generated and applied to the DLL circuit so as to reset the DLL circuit. In general, the semiconductor memory device generates a pulse signal using the inputted clock signal, and then generates the reset signal using the pulse signal to reset the DLL circuit. However, as the frequency of the clock signal inputted to the semiconductor memory device becomes higher, it is more difficult to stably generate the reset signal for resetting the DLL circuit.

SUMMARY OF THE INVENTION

Embodiments of the present invention are directed at providing a semiconductor memory device capable of stably resetting an internal circuit in response to a reset operation that is externally controlled.

Embodiments of the present invention are also directed at providing a semiconductor memory device capable of stably controlling a reset operation of a delay locked loop (DLL) circuit.

In accordance with an aspect of the present invention, there is provided a semiconductor memory device, including: a pulse signal generator configured to combine a plurality of external command signals to generate a normal register control signal and an extended register control signal in response to a clock signal; a reset signal generator configured to receive operating information of a delay locked loop (DLL) circuit from an outside to generate a reset signal for a reset operation of the DLL circuit in response to the normal register control signal or the extended register control signal; and the DLL circuit configured to perform a reset operation in response to the reset signal.

In accordance with an aspect of the present invention, there is provided a method for driving a semiconductor memory device, including: a pulse signal generator for generating a normal register control signal and an extended register control signal by combining a plurality of external command signals in response to a clock signal; an extended mode register set (EMRS) register for storing a control signal for enabling a delay locked loop (DLL) circuit in response to the extended register control signal; a reset signal generator for generating a reset signal for a reset operation of the DLL circuit in response to the normal register control signal or generating the reset signal by receiving operating information of the DLL circuit in response to the extended register control signal; and the DLL circuit enabled in response to the control signal, for performing the reset operation in response to the reset signal.

In accordance with an aspect of the present invention, there is provided a semiconductor memory device, including: combining a plurality of external command signals to generate a normal register control signal or an extended register control signal in response to a clock signal; receiving operating information of a delay locked loop (DLL) circuit from an outside to generate a reset signal for a reset operation of the DLL circuit in response to the normal register control signal or the extended register control signal; and performing a reset operation of the DLL circuit in response to the reset signal.

In accordance with an aspect of the present invention, there is provided a method for driving a semiconductor memory device, including: combining a plurality of external command signals to generate a normal register control signal or an extended register control signal in response to a clock signal; storing a control signal for an operation of a delay locked loop (DLL) circuit in an extended mode register set (EMRS) register in response to the extended register control signal; generating a reset signal for a reset operation of the DLL circuit in response to the normal register control signal or generating the reset signal by receiving operating information of the DLL circuit in response to the extended register control signal; and performing the reset operation of the DLL circuit in response to the reset signal, the DLL circuit enabled in response to the control signal.

DESCRIPTION OF SPECIFIC EMBODIMENTS

Hereinafter, a semiconductor memory device capable of stably resetting an internal circuit in response to a reset operation externally controlled in accordance with the present invention will be described in detail with reference to the accompanying drawings.

Figure 1:
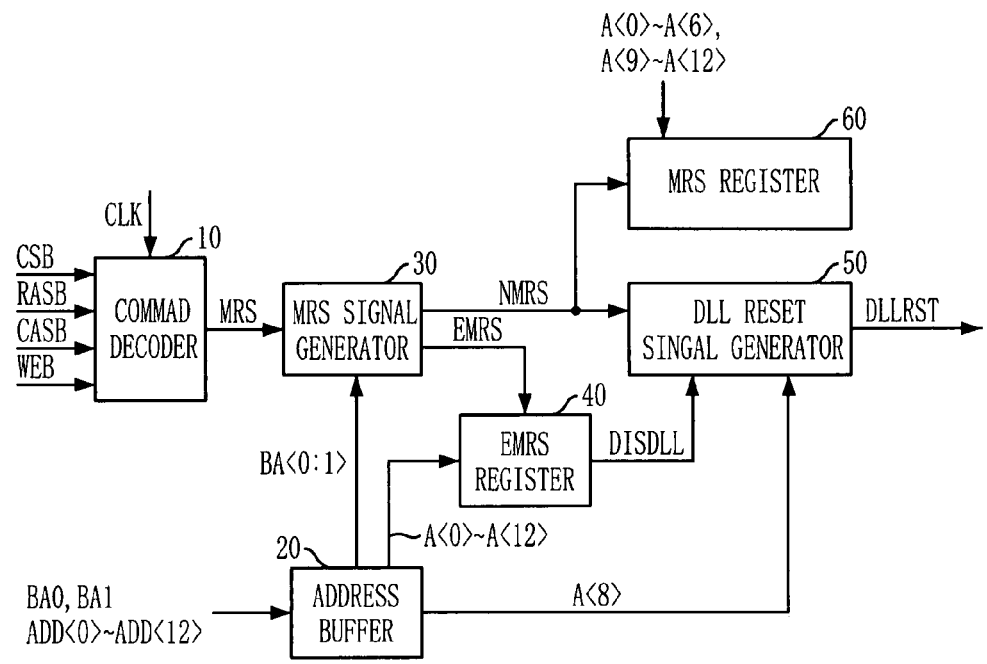
FIG. 1 is a block diagram of a semiconductor memory device.

FIG. 1 is a block diagram of a semiconductor memory device.

Referring to FIG. 1, the semiconductor memory device includes a command decoder 10, an address buffer 20, a mode register set (MRS) signal generator 30, an extended MRS (EMRS) register 40, a delay locked loop (DLL) reset signal generator 50, and an MRS register 60.

The command decoder 10 receives command signals CSB, RASB, CASB and WEB in synchronization with a clock signal CLK, and decodes them to generate a register control signal MRS. In particular, the command decoder 10 generates the register control signal MRS of which a pulse width is equal to that of the clock signal CLK.

The address buffer 20 receives a plurality of addresses ADD<0> to ADD<12>, BA0 and BA1, and transfers them to address signal processing units of the semiconductor memory device. In addition, the address buffer unit 20 receives code signals, which are used to set an operation mode of the semiconductor memory device, through an input path of the addresses ADD<0> to ADD<12>, BA0 and BA1, and transfers them to the EMRS register 40, the MRS signal generator 30, the DLL reset signal generator 50, and the MRS register 60. In detail, the address buffer 20 transfers a code signal BA<0:1> inputted through a pad where the bank addresses BA0 and BA1 are inputted to the MRS signal generator 30, a code signal A<0> to A<12> inputted through a pad where the addresses ADD<0> to ADD<12> are inputted to the EMRS register 40, a code signal A<8> to the DLL reset signal generator 50, and a code signal A<0> to A<6> and A<9> to A<12> to the MRS register 60.

The MRS signal generator 30 receives the register control signal MRS to generate a normal register control signal NMRS and an extended register control signal EMRS, each having a pulse type, in response to the code signal BA<0:1>. For example, the MRS signal generator 30 generates the normal register control signal NMRS when the code signal BA<0:1> is "00", and the extended register control signal EMRS when the code signal BA<0:1> is "01".

The EMRS register 40 receives the code signal A<0> to latch it in response to the extended register control signal EMRS. Furthermore, the EMRS register 40 generates a DLL control signal DISDLL for controlling an operation of a DLL circuit by using the latched signal. For reference, the DLL control signal DISDLL has a logic high level when the DLL circuit is not operating, and has a logic low level when the DLL circuit is operating.

The DLL reset signal generator 50 generates a DLL reset signal DLLRST for controlling a reset operation of the DLL circuit in response to the normal register control signal NMRS or the DLL control signal DISDLL.

The MRS register 60 latches the code signal A<0> to A<6> and A<9> to A<12> in response to the normal register control signal NMRS. The latched signal is for setting an operation mode of the semiconductor memory device. Accordingly, the signal for controlling the operation of the DLL circuit, i.e., the DLL control signal DISDLL, is only latched by the EMRS register 40, not the MRS register 60.

When the command signals are inputted from the outside, the command decoder 10 generates the pulse type register control signal MRS in synchronization with the clock signal CLK, and the MRS signal generator 30 generates the normal register control signal NMRS or the extended register control signal EMRS in response to the code signals BA<0:1> outputted from the address buffer 20. Herein, the normal register control signal NMRS or the extended register control signal EMRS is also a pulse type signal similar to the register control signal MRS. Hence, the command decoder 10 and the MRS signal generator 30 constitute blocks for generating the normal register control signal NMRS or the extended register control signal EMRS.

The EMRS register 40 latches the code signal A<0> in response to the extended register control signal EMRS, and generates the DLL control signal DISDLL. The DLL reset signal generator 50 generates the DLL reset signal DLLRST by receiving the normal register control signal NMRS and the code signal A<8> or generates the DLL reset signal DLLRST by receiving the DLL control signal DISDLL. Herein, the code signal A<8> is activated when setting a mode register set (MRS). The DLL reset signal DLLRST controls the reset operation of the DLL circuit.

There are two methods of externally controlling the reset operation of the DLL circuit of the semiconductor memory device. As one of the two methods, the normal register control signal NMRS is internally generated, and the DLL reset signal generator 50 then receives the code signal A<8> to generate the DLL reset signal DLLRST in response to the normal register control signal NMRS. The other method is performed in such a way that the extended register control signal EMRS is internally generated, the EMRS register 40 latches the code signal A<0> in response to the extended register control signal EMRS, and the DLL reset signal generator 50 generates the DLL reset signal DLLRST using the latched signal of the EMRS register 40. In particular, the DLL control signal DISDLL supplied by the latched signal of the EMRS register 40 is also used in determining an operation state of the DLL circuit. That is, when the DLL control signal DISDLL is activated, the DLL circuit is operating; however, when the DLL control signal DISDLL is deactivated, the DLL circuit does not operate. In the semiconductor memory device, the DLL circuit does not always operate but operates only if necessary. When frequency of a system clock inputted to the semiconductor memory device is not high, it is possible to output data to the outside substantially in synchronization with a transition point of the system clock without the operation of the DLL circuit.

The reason why the reset operation of the DLL is controlled through the two control modes is that there may be two cases according to a controller for controlling the semiconductor memory device, i.e., one case where the MRS register and the EMRS register are sequentially set and controlled, and the other case where the EMRS register and the MRS register are separately controlled. In other words, the control of reset operation of DLL according to the two control modes facilitates the reset control of the DLL circuit even in the case where any one of the two registers included in the semiconductor memory device is selectively controlled.

Figure 2:
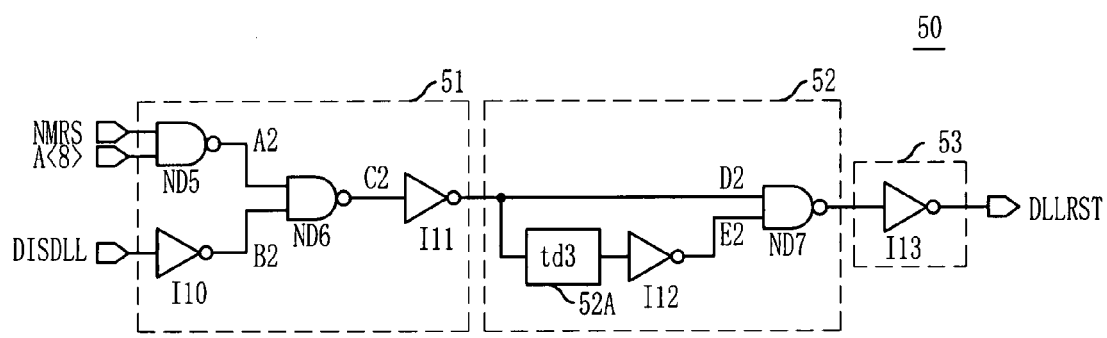
FIG. 2 is a delay locked loop (DLL) reset signal generator shown in FIG. 1.

FIG. 2 is the DLL reset signal generator 50 shown in FIG. 1.

Referring to FIG. 2, the DLL reset signal generator 50 includes a signal transferring unit 51, a pulse width extension unit 52, and a reset signal output unit 53.

The signal transferring unit 51 includes first and second NAND gates ND5 and ND6 and first and second inverters I10 and I11, for transferring the normal register control signal NMRS, the code signal A<8> and the DLL control signal DISDLL to the pulse width extension unit 52. In detail, the first NAND gate ND5 performs a NAND operation on the normal register control signal NMRS and the code signal A<8>, the first inverter I10 inverts the DLL control signal DISDLL applied from the EMRS register 40. The second NAND gate N6 performs a NAND operation on output signals of the first inverter I10 and the first NAND gate ND5, and the second inverter I11 inverts an output of the second NAND gate N6. Here, as described above, the normal register control signal NMRS is a signal generated from the MRS signal generator 30, and thus has a pulse width corresponding to that of the clock signal CLK. The DLL control signal DISDLL is supplied from the EMRS register 40.

The pulse width extension unit 52 includes a delay unit 52A, a third inverter I12, and a third NAND gate ND7, for extending a pulse width of the signal transferred from the signal transferring unit 51.

The reset signal output unit 53 includes a fourth inverter I14, for outputting the DLL reset signal DLLRST. The DLL reset signal DLLRST is used for resetting the DLL circuit.

Figure 3:
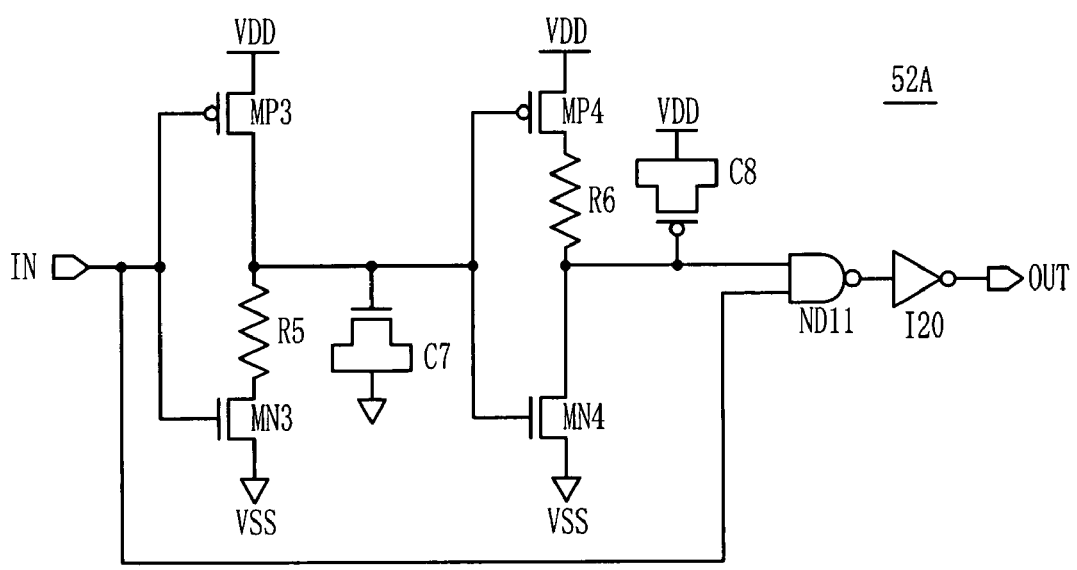
FIG. 3 is a circuit diagram illustrating a delay unit of FIG. 2.

FIG. 3 is a circuit diagram illustrating the delay unit 52A shown in FIG. 2.

Referring to FIG. 3, the delay unit 52A includes a NAND gate ND11, an inverter I20, capacitors C7 and C8, resistors R5 and R6, and MOS transistors MP3, MP4, MN3 and MN4.

Figure 4:
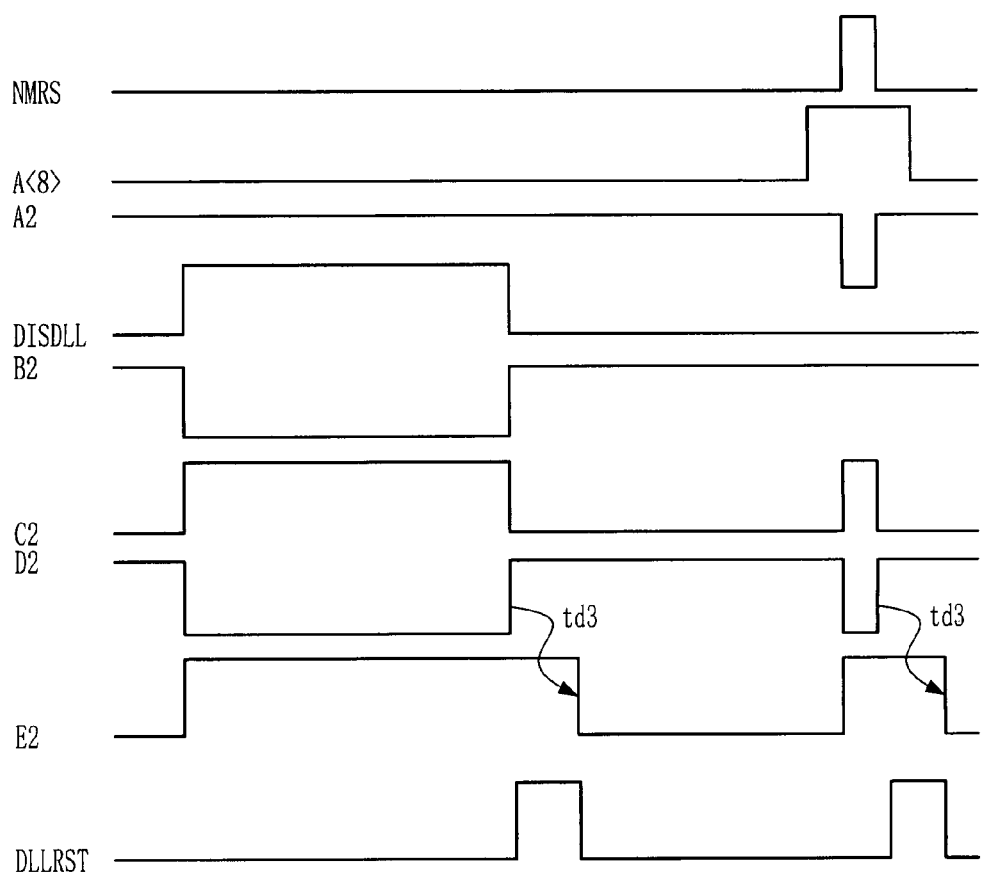
FIG. 4 is a waveform diagram illustrating an operation of the DLL reset signal generator shown in FIG. 1.

FIG. 4 is a waveform diagram illustrating an operation of the DLL reset signal generator shown in FIG. 1.

Referring to FIG. 4, there are shown waveforms of output signals at respective nodes of the DLL reset signal generator 50 when the normal register control signal NMRS, the code signal A<8> and the DLL control signal DISDLL are inputted into the DLL reset signal generator 50. At a node E2, a signal of which a width is extended by a delay value "td3" through the delay unit 52A, the third inverter I12 and the third NAND gate ND7, is applied to an output terminal of the NAND gate ND7. Lastly, the pulse type DLL reset signal DLLRST of a logic high level is generated.

In particular, as described above, there are two cases that the DLL reset signal generator 50 activates the pulse type DLL reset signal DLLRST to a logic high level. One case is that a pulse signal of a logic high level is generated in response to the activation of the DLL control signal DISDLL when the DLL control signal DISDLL applied from the EMRS register 40 is activated to a logic high level. The other case is that the DLL reset signal generator 50 generates the DLL reset signal DLLRST of a logic high level in response to the normal register control signal NMRS and the code signal A<8>. That is, the former case is to directly control the reset operation by receiving external command signals without passing through the EMRS register 40. The latter case is to externally control the reset operation of the DLL circuit using information stored in the EMRS register 40.

Figure 5:
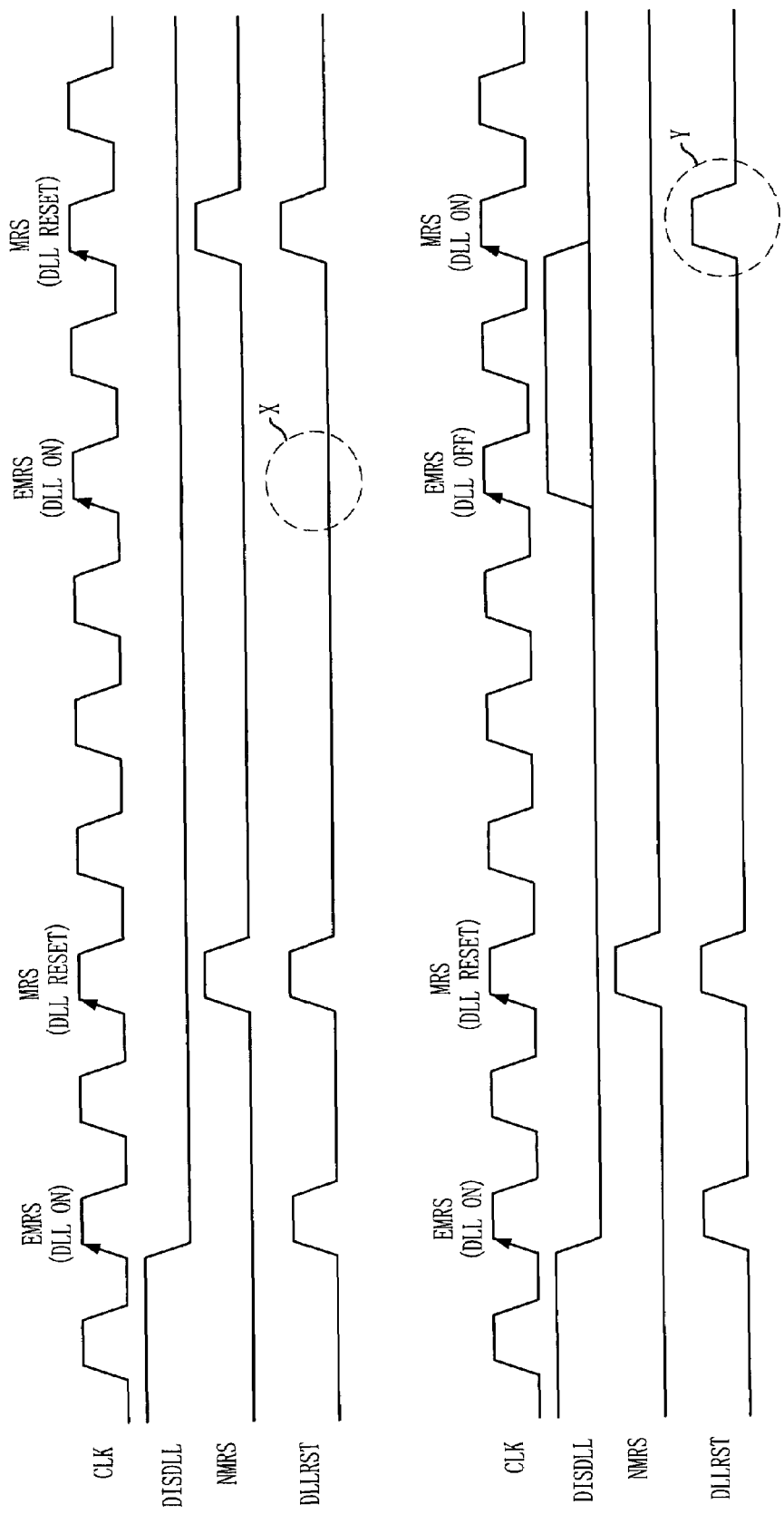
FIG. 5 is a waveform diagram illustrating a problem when the DLL reset signal generator shown in FIG. 1 operates.

FIG. 5 is a waveform diagram illustrating a problem when the DLL reset signal generator shown in FIG. 2 operates.

As shown, the DLL reset signal generator 50 can stably generate the DLL reset signal DLLRST when the DLL reset signal DLLRST is generated in response to the normal register control signal NMRS and the code signal A<8>. However, it is difficult for the DLL reset signal generator 50 to stably generate the DLL reset signal DLLRST when the DLL reset signal DLLRST is generated in response to the DLL control signal DISDLL outputted from the EMRS register 40. The DLL control signal DISDLL has a predetermined level as it is generated from the EMRS register 40. Therefore, the DLL reset signal DLLRST cannot be activated to a logic high level so as to reset the DLL circuit in synchronization with the clock signal (see "X" of FIG. 5). To resolve it, it is necessary to transit the DLL control signal DISDLL outputted from the EMRS register 40 to be a logic high level and transits it to be a logic low level again, as illustrated in a waveform diagram in the below of FIG. 5. During the transitions, the DLL circuit is enabled at timing that the DLL control signal DISDLL is transited to a logic high level, and the DLL reset signal DLLRST is generated while the DLL control signal DISDLL is transited to a logic low level (see "Y" of FIG. 5).

As such, the present invention provides a semiconductor memory device that can internally activate the DLL reset signal DLLRST in response to the EMRS control command stably.

Figure 6:
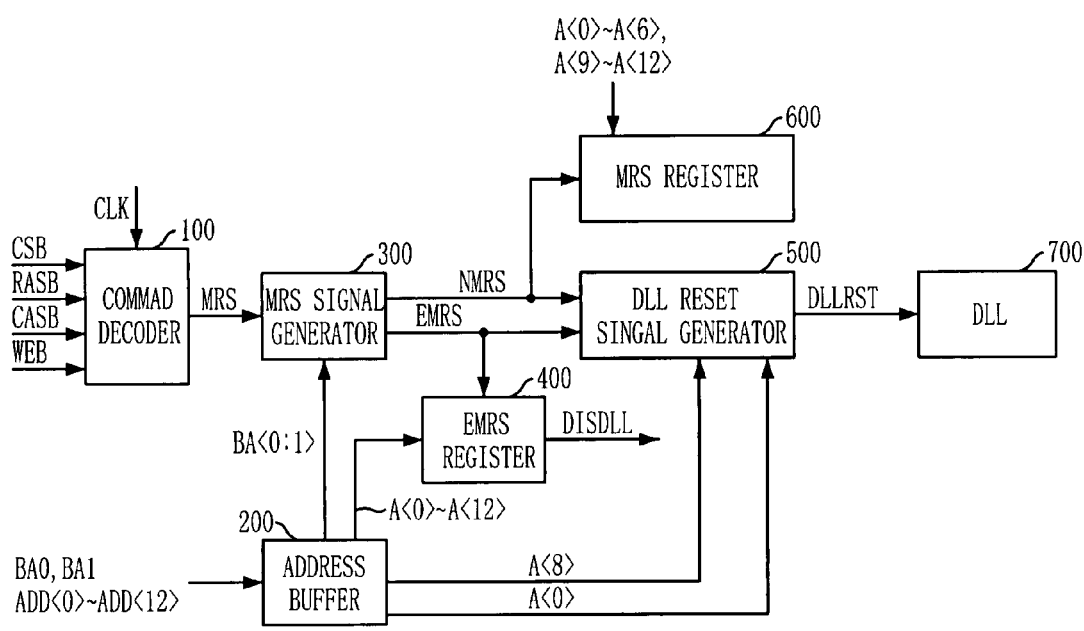
FIG. 6 is a circuit diagram of a semiconductor memory device in accordance with a first embodiment of the present invention.

FIG. 6 is a circuit diagram of a semiconductor memory device in accordance with a first embodiment of the present invention.

As shown, the semiconductor memory device in accordance with this embodiment includes a command decoder 100, an address buffer 200, an MRS signal generator 300, an EMRS register 400, a DLL reset signal generator 500, and an MRS register 600. The command decoder 100, the address buffer 200, the MRS signal generator 300, the EMRS register 400, and the MRS register 600 perform substantially the same functions as those of circuit blocks as illustrated in the semiconductor memory device of FIG. 1. Here, the command decoder 100 and the MRS signal generator 300 act as a pulse signal generator that combines command signals CSB, RASB, CASB and WEB inputted from the outside to generate a normal register control signal NMRS and an extended register control signal EMRS, each having a pulse type.

In addition, the DLL reset signal generator 500 receives reset information of a DLL circuit 700 from the outside to generate a DLL reset signal DLLRST for a reset operation of the DLL circuit 700 in response to the normal register control signal NMRS or the extended register control signal EMRS. Here, the DLL reset signal generator 500 receives the reset information based on the code signals A<8> and A<0> outputted from the address buffer 200. The code signal A<0> has a logic low level during the DLL circuit 700 is operating. The DLL reset signal DLLRST controls the reset operation of the DLL circuit 700.

The DLL reset signal generator 500 of FIG. 6 receives both the normal register control signal NMRS and the extended register control signal EMRS, which is different from the DLL reset signal generator 50 of FIG. 1. Specifically, the DLL reset signal generator 500 receives the code signal A<8> to generate the DLL reset signal DLLRST in response to the normal register control signal NMRS, or receives the code signal A<0> to generate the DLL reset signal DLLRST in response to the extended register control signal EMRS. Herein, the DLL reset signal generator 500 of FIG. 6 generates the DLL reset signal DLLRST in response to the extended register control signal EMRS and the code signal A<0> having information relating to an operation of the DLL circuit while the DLL reset signal generator 50 of FIG. 1 generates the DLL reset signal DLLRST in response to the DLL control signal DISDLL having the information relating to the operation of the DLL circuit.

Meanwhile, the DLL control signal DISDLL outputted from the EMRS register 400 is used for controlling the DLL circuit 700, but is not used for generating the DLL reset signal DLLRST in the DLL reset signal generator 500.

The DLL reset signal generator 500 may generate the DLL reset signal DLLRST in response to the extended register control signal EMRS using the DLL control signal DISDLL. In this case, it is unnecessary to receive the code signal A<0> from the DLL reset signal generator 500.

Figure 7:
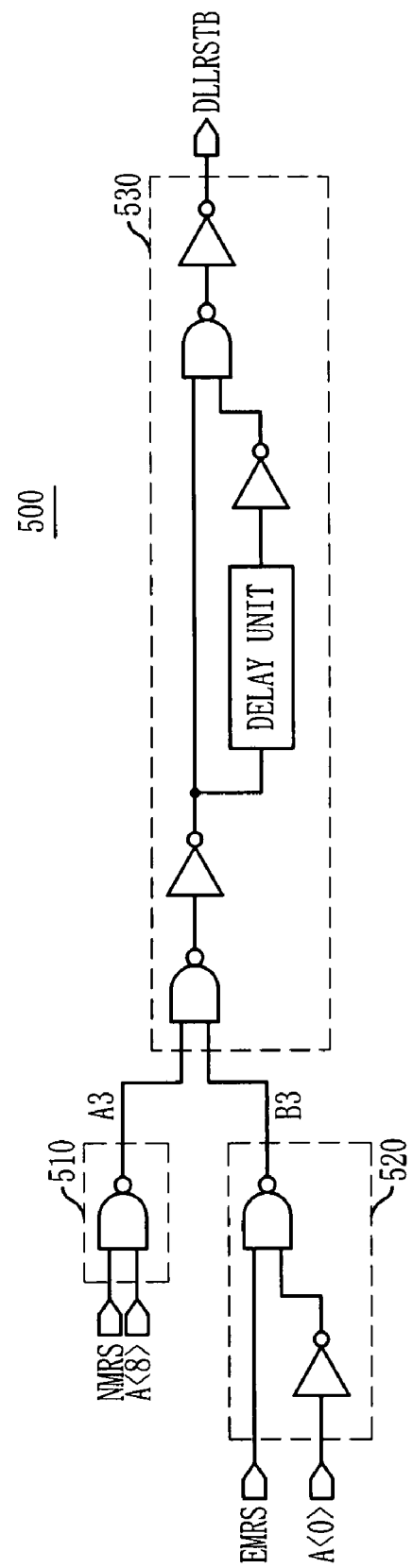
FIG. 7 is a circuit diagram illustrating a DLL reset signal generator shown in FIG. 6.

FIG. 7 is a circuit diagram illustrating the DLL reset signal generator 500 shown in FIG. 6.

Referring to FIG. 7, the DLL reset signal generator 500 includes a first code transferring unit 510, a second code transferring unit 520, and a reset signal output unit 530.

The first code transferring unit 510 transfers the code signal A<8> outputted from the address buffer 200 in response to the normal register control signal NMRS. The second code transferring unit 520 transfers the code signal A<0> outputted from the address buffer 200 in response to the extended register control signal EMRS. The reset signal output unit 530 converts an output signal of the first code transferring unit 510 or an output signal of the second code transferring unit 520 into a pulse signal so as to output the DLL reset signal DLLRST.

Figure 8:
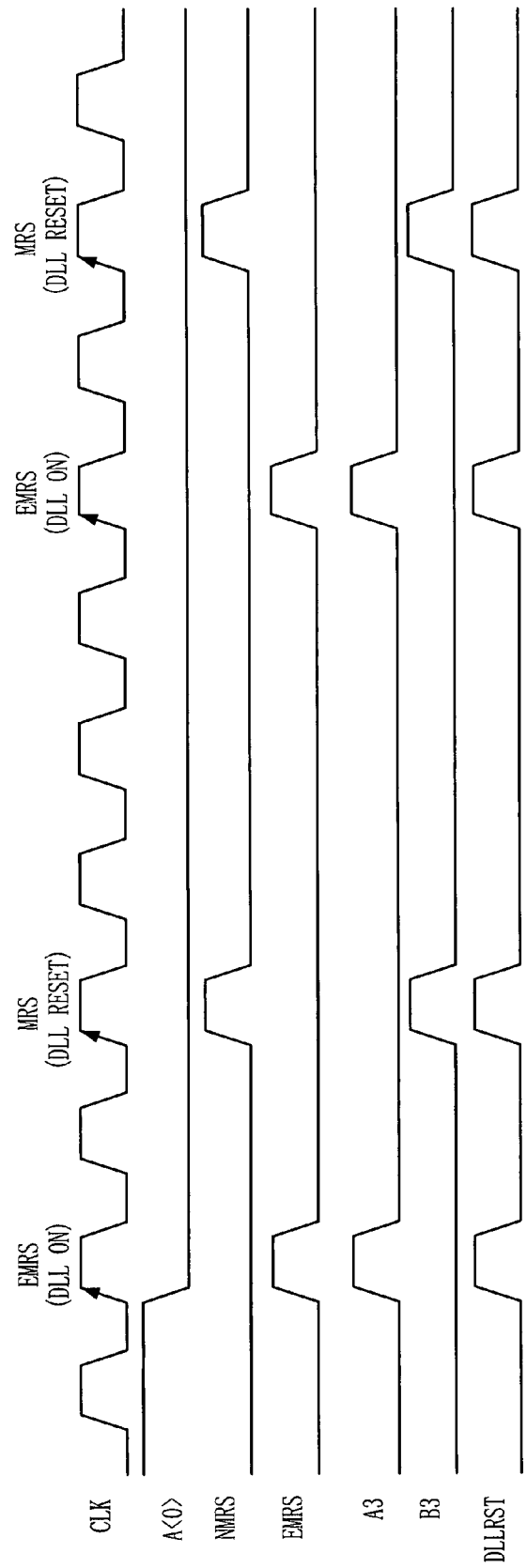
FIG. 8 is a waveform diagram illustrating an operation of the semiconductor memory device shown in FIG. 6.

FIG. 8 is a waveform diagram illustrating an operation of the semiconductor memory device shown in FIG. 6.

Referring to FIG. 8, since the DLL reset signal generator 500 of this embodiment receives the code signal A<8> to generate the DLL reset signal DLLRST in response to the normal register control signal NMRS or receives the code signal A<0> to generate the DLL reset signal DLLRST in response to the extended register control signal EMRS, it is possible to generate the DLL reset signal DLLRST at an intended timing although the DLL control signal DISDLL outputted from the MRS register 400 is a level signal. Accordingly, the reset operation of the DLL circuit can be stably performed without error even if the DLL circuit is operating.

Figure 9:
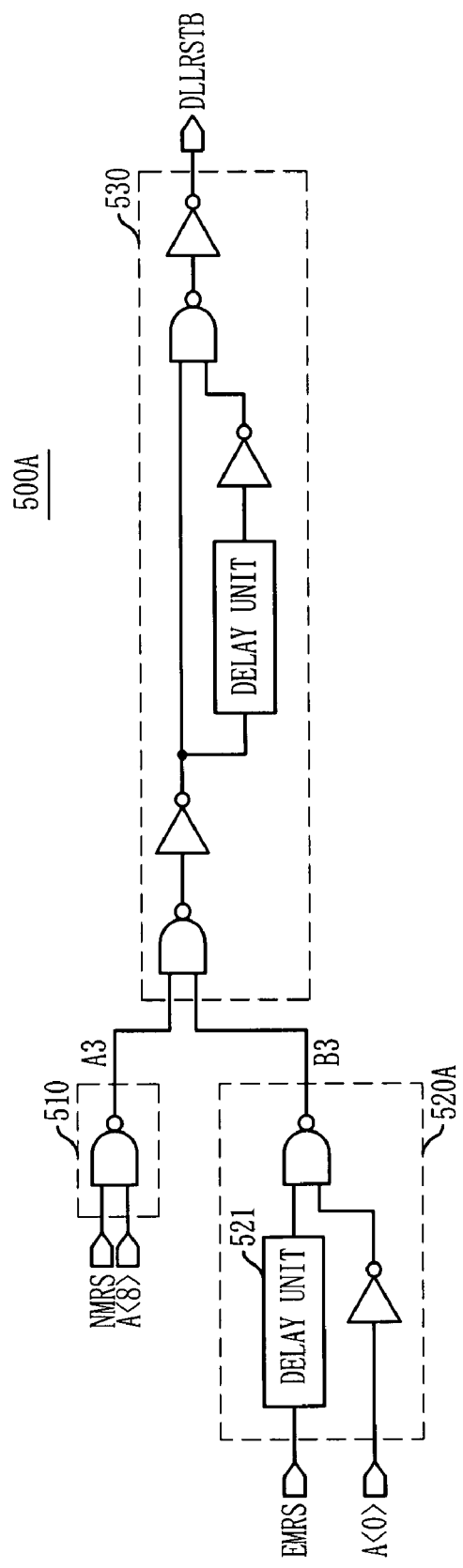
FIG. 9 is a circuit diagram of a DLL reset signal generator in accordance with a second embodiment of the present invention.

FIG. 9 is a circuit diagram of a DLL reset signal generator 500A in accordance with a second embodiment of the present invention.

Referring to FIG. 9, the DLL reset signal generator 500A in accordance with the second embodiment has the same configuration as the DLL reset signal generator 500 of FIG. 7 except that a second code transferring unit 520A further includes a delay unit 521. The delay unit 521 compensates for a difference between the time point at which the extended register control signal EMRS and the time point at which the code signal A<0> are transferred to the reset signal generator 500.

As described above, in accordance with the present invention, the reset operation of the DLL circuit can be controlled with ease. In addition, the reset signal of the DLL circuit can be stably generated while the level signal, i.e., the control signal outputted from the EMRS register is not transited. Therefore, it is possible to reset the DLL circuit at an intended timing accurately during the operation of the semiconductor memory device, thus improving reliability in operation of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a pulse signal generator configured to combine a plurality of external command signals to generate a normal register control signal or an extended register control signal in response to a clock signal;
   a reset signal generator configured to receive an operating information signal of a delay locked loop (DLL) circuit to generate a reset signal for a reset operation of the DLL circuit in response to the normal register control signal or the extended register control signal; and
   the DLL circuit configured to perform a reset operation in response to the reset signals,
   wherein the operating information signal of the DLL circuit indicates whether the DLL circuit is in operation.

2. The semiconductor memory device as recited in claim 1, further comprising an extended mode register set (EMRS) register adapted to receive the operating information of the DLL circuit to store the operating information in response to the extended register control signal.

3. The semiconductor memory device as recited in claim 2, wherein the reset signal generator generates the reset signal without passing through the EMRS register.

4. The semiconductor memory device as recited in claim 1, further comprising an address buffer adapted to receive and transfer an address to a memory core region or receive the operating information of the DLL circuit through an address pad, where the address is inputted, to output the operating information to the reset signal generator.

5. The semiconductor memory device as recited in claim 4, wherein the reset signal generator generates the reset signal in response to the normal register control signal to directly control the reset operation by receiving an external command signal, and in response to the extended register control signal to externally control the reset operation by using the operating information.

6. The semiconductor memory device as recited in claim 4, wherein the pulse signal generator comprises:
   a command decoder configured to receive and decode the external command signals; and
   a pulse output unit configured to receive an output signal of the command decoder to output the extended register control signal and the normal register control signal in response to a first code signal outputted from the address buffer.

7. The semiconductor memory device as recited in claim 6, wherein the reset signal generator comprises:
a first code transferring unit adapted to transfer a second code signal outputted from the address buffer in response to the normal register control signal;
a second code transferring unit adapted to transfer a third code signal outputted from the address buffer in response to the extended register control signal; and
a reset signal generator adapted to convert an output signal of the first or second code transferring unit into a pulse signal and output the pulse signal as the reset signal.

8. The semiconductor memory device as recited in claim 7, wherein the second code signal is activated when setting a mode register set (MRS), and the third code signal includes the operating information of the DLL circuit.

9. The semiconductor memory device as recited in claim 7, wherein the second code transferring unit comprises a delay unit configured to compensate for a difference between the time point at which the extended register control signal is transferred to the reset signal generator and the time point at which the third code signal is transferred to the reset signal generator.

10. A semiconductor memory device, comprising:
a pulse signal generator for generating a normal register control signal and an extended register control signal by combining a plurality of external command signals in response to a clock signal;
an extended mode register set (EMLRS) register for storing a control signal for enabling a delay locked loop (DLL) circuit in response to the extended register control signal;
a reset signal generator for receiving operating information of the DLL circuit to generate a reset signal for a reset operation of the DLL circuit in response to the normal register control signal or generate the reset signal based on the control signal stored in the EMRS register in response to the EMRS pulse; and
the DLL circuit enabled in response to the control signal, for performing the reset operation m response to the reset signal.

11. The semiconductor memory device as recited in claim 10, further comprising an address buffer adapted to receive and transfer an address to a memory core region or receive the operating information of the DLL circuit through an address pad, where the address is inputted, to output the operating information to the reset signal generator.

12. The semiconductor memory device as recited in claim 11, wherein the pulse signal generator comprises:
a command decoder configured to receive and decode the external command signals from the outside; and
a pulse output unit configured to receive an output signal of the command decoder to output the extended register control signal and the normal register control signal in response to a first code signal outputted from the address buffer.

13. The semiconductor memory device as recited in claim 12, wherein the reset signal generator comprises:
a first code transferring unit adapted to transfer a second code signal outputted from the address buffer in response to the normal register control signal;
a second code transferring unit adapted to transfer a third code signal outputted from the address buffer in response to the extended register control signal; and
a reset signal generator adapted to convert an output signal of the first or second code transferring unit into a pulse signal to output the pulse signal as the reset signal.

14. The semiconductor memory device as recited in claim 13, wherein the second code signal is activated when setting a mode register set (MRS), and the third code signal includes the operating information of the DLL circuit.

15. A method for driving a semiconductor memory device, comprising:
combining a plurality of external command signals to generate a normal register control signal or an extended register control signal in response to a clock signal;
receiving an operating information signal of a delay locked loop (DLL) circuit to generate a reset signal for a reset operation of the DLL circuit in response to the normal register control signal or the extended register control signal; and
performing a reset operation of the DLL circuit in response to the reset signals,
wherein the operating information signal of the DLL circuit indicates whether the DLL circuit is in operation.

16. The method as recited in claim 15, wherein the reset signal is generated in response to the normal register control signal to directly control the reset operation by receiving an external command signal, and in response to the extended register control signal to externally control the reset operation by using the operating information.

17. The method as recited in claim 15, wherein the generating of the normal register control signal and the extended register control signal comprises:
decoding the command signals; and
outputting the decoded signal as the extended register control signal or the normal register control signal in response to a code signal inputted through an address pad.

18. A method for driving a semiconductor memory device, comprising:
combining a plurality of external command signals to generate a normal register control signal or an extended register control signal in response to a clock signal;
storing a control signal for an operation of a delay locked loop (DLL) circuit in an extended mode register set (EMRS) register in response to the extended register control signal;
generating a reset signal for a reset operation of the DLL circuit in response to the normal register control signal or generating the reset signal by receiving operating information of the DLL circuit in response to the extended register control signal; and
performing the reset operation of the DLL circuit in response to the reset signal, the DLL circuit being enabled in response to the control signal.

19. The method as recited in claim 18, wherein the normal register control signal and the extended register control signal have a pulse type.

20. The method as recited in claim 18, wherein the generating of the normal register control signal and the extended register control signal comprises:
receiving the external command signals to decode them; and
outputting the decoded signal as the extended register control signal or the normal register control signal in response to a code signal inputted through an address pad.

* * * * *